US010930774B2

(12) United States Patent
Hsieh

(10) Patent No.: US 10,930,774 B2
(45) Date of Patent: Feb. 23, 2021

(54) SHIELDED GATE TRENCH MOSFETS WITH FLOATING TRENCHED GATES AND CHANNEL STOP TRENCHED GATES IN TERMINATION

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 0 days.

(21) Appl. No.: 16/512,538

(22) Filed: Jul. 16, 2019

(65) Prior Publication Data
US 2021/0020776 A1  Jan. 21, 2021

(51) Int. Cl.
| H01L 29/78 | (2006.01) |
| H01L 29/06 | (2006.01) |
| H01L 29/08 | (2006.01) |
| H01L 29/40 | (2006.01) |
| H01L 23/544 | (2006.01) |
| H01L 29/10 | (2006.01) |

(52) U.S. Cl.
CPC ........ *H01L 29/7811* (2013.01); *H01L 23/544* (2013.01); *H01L 29/0638* (2013.01); *H01L 29/0696* (2013.01); *H01L 29/086* (2013.01); *H01L 29/1095* (2013.01); *H01L 29/404* (2013.01); *H01L 29/407* (2013.01); *H01L 29/7813* (2013.01); *H01L 2223/5446* (2013.01)

(58) Field of Classification Search
CPC ............ H01L 29/7811; H01L 29/0638; H01L 29/0696; H01L 29/086; H01L 29/1095; H01L 29/404; H01L 29/407; H01L 23/544
See application file for complete search history.

(56) References Cited

U.S. PATENT DOCUMENTS 8,643,092 B2    2/2014  Hsieh
2014/0291753 A1*  10/2014  Hsieh .................. H01L 29/7813
                                                        257/330

* cited by examiner

*Primary Examiner* — Marc Anthony Armand
(74) *Attorney, Agent, or Firm* — Bacon & Thomas, PLLC

(57) ABSTRACT

A trench MOSFET is disclosed having shielded trenched gates in active area, multiple floating trenched gates and at least one channel stop trenched gate in termination area. A semiconductor power device layout is disclosed consisting of at least two said trench MOSFETs connected together with multiple sawing trenched gates across a space between the two trench MOSFETs having a width same as scribe line, making the invented trench MOSFET be feasibly achieved without degraded performance.

13 Claims, 18 Drawing Sheets

SHIELDED GATE TRENCH MOSFETS WITH FLOATING TRENCHED GATES AND CHANNEL STOP TRENCHED GATES IN TERMINATION

FIELD OF THE INVENTION

This invention relates generally to the cell structure and layout structure of power semiconductor devices. More particularly, this invention relates to a novel and improved cell structure and layout structure for fabricating shielded trench metal-oxide-semiconductor-field-effect-transistors (MOSFETs) with floating trenched gates and channel stop gates in termination.

BACKGROUND OF THE INVENTION

A trench metal-oxide-semiconductor-field-effect-transistor (MOSFET) having shielded gate structure in active area is more attractive due to its reduced Cgd (capacitance between gate and drain) in accordance with reduced Qgd (charge between gate and drain) and lower Rsp (Specific on-resistance). However, in some prior arts, design of a termination area surrounding the active area can lead to degraded performance in breakdown voltage of the trench MOSFET. For example, in U.S. Pat. No. 8,643,092, an N type trench MOSFET was disclosed with shielded trenched gates in the active area and multiple floating trenched gates in the termination area, please refer to the top view in FIG. 1A. Further refer to FIG. 1B for A B C D E F G cross section of FIG. 1A, it can be seen that the termination area is only composed of multiple trenched floating gates (FTG1, FTG2, and FTG3) between gate contact area (E-F) and scribe line (S.L). However, if there is enough negative charge built in gate oxide (GOX), floating trenched gates may induce positive charge forming multiple P type channeling regions (Pi) along an interface between floating trenched gates and N epitaxial layer (N EPI), causing a leakage path (as illustrated) between drain region and source region through a conductive path formed in scribe line by die sawing. Therefore, an electrical current will directly flow from edge of the termination area to n+ source regions in the active area without being blocked by the floating trenched gates in the termination area.

Therefore, there is still a need in the art of the semiconductor device and design and fabrication, particularly for shielded trench MOSFETs design and fabrication, to provide a novel cell structure, device configuration and fabrication process that would resolve the difficulties mentioned above. Specifically, it is desirable to maintain breakdown voltage in the termination area of a trench MOSFET.

SUMMARY OF THE INVENTION

The present invention provides shielded trench MOSFET having shielded gates in active area and floating trenched gates in termination area, specifically, the present invention also introduces channel stop gates in the termination area to prevent formation of a leakage path between drain region and source region. Meanwhile, since main die area and scribe line area are sometime designed by different parties such as the main die is designed by design house and the scribe line is designed by foundry, the invention may not be feasibly achieved by a single die layout, therefore, the present invention discloses a layout way to make it happen by providing a device consist of at least two trench MOSFETs.

According to one aspect, the invention features a semiconductor power device layout consisted of at least two shielded trench MOSFETs with each comprises: multiple floating trenched gates formed in parallel in a termination area around outside of an active area, the multiple floating trenched gates all have floating voltage and are surrounded by body regions without having source regions whereon, the multiple floating trenched gates all have trench depth equal to or deeper than junction depth of the body regions; at least one channel stop trenched gate formed in the termination area and around outside of the multiple floating trenched gates, each the channel stop trenched gate is connected to at least one sawing trenched gate which is extended across over a scribe line.

According to another aspect, the at least one channel stop trenched gate and the at least one sawing trenched gate of each trench MOSFET are all shorted with a drain region after die sawing through the at least one sawing trenched gate for separation of the at least two shielded trench MOSFETs.

According to another aspect, the invention also features a trench MOSFET comprises: a substrate of a first conductivity type coated with a drain metal on rear side; an epitaxial layer of the first conductivity type grown on the substrate and having a lower doping concentration than the substrate; a plurality of source regions of the first conductivity type formed near top surface of the epitaxial layer only within the active area, the source regions have a doping concentration higher than the epitaxial layer; a plurality of first type body regions of a second conductivity type formed underneath the source regions in the active area; a plurality of second type body regions of the second conductivity type formed inside and from the top surface of the epitaxial layer in the termination area and around outside of the active area; the source regions are not disposed in top of the second type body regions; an insulation layer formed on the epitaxial layer; a plurality of shielded trenched gates having dual electrodes in the active area, each comprises a gate electrode disposed in upper portion and a shielded electrode in lower portion, wherein the gate electrode and the shielded electrode are insulated from each other by an inter-electrode-insulation layer; the gate electrode in each shielded trenched gate is connected to a gate metal formed over the insulation layer and the shielded electrode is connected to a source metal formed over the insulation layer; each the shielded trenched gate in the active area further comprises a first type gate oxide layer surrounding bottom and sidewalls of the shielded electrode and a second type gate oxide along sidewalls of the gate electrode; the multiple floating trenched gates having floating voltage are formed in parallel in the termination area around outside of the active area, the multiple floating trenched gates are surrounded by the second type body region and extending downward into the epitaxial layer, the multiple floating trenched gates have trench depth equal to or deeper than junction depth of the second type body regions; the second type body regions between every two adjacent floating trenched gates in the termination area have floating voltage; at least one channel stop trenched gate formed in the termination area and around outside of the multiple floating trenched gates, each the channel stop trenched gate is connected to at least one sawing trenched gate which extending across a scribe line.

According to another aspect, in some preferred embodiments, each of the multiple floating trenched gates in the termination area comprises a single shielded electrode having the same conductive material as the shielded electrode in the active area, and padded by the first type gate oxide. In some other preferred embodiments, each of the multiple floating trenched gates in the termination area has dual electrodes, which is the same as the shielded trenched gates in the active area. In some other preferred embodiment, some of the multiple floating trenched gates in the termination area have single shielded electrode while others have dual electrodes.

According to another aspect, in some preferred embodiments, the at least one channel stop trenched gate comprises a single shielded electrode having the same conductive material as the shielded electrode in the active area, and padded by the first type gate oxide. In some other preferred embodiments, the at least one channel stop trenched gates comprises dual electrodes, which is the same as the shielded trenched gates in the active area.

According to another aspect, in some preferred embodiments, the source regions in the active area have uniform doping concentration and junction depth along the top surface of the epitaxial layer. In some other preferred embodiments, each of the source regions has a doping concentration of Gaussian-distribution from edge of a trenched source-body contact to an adjacent channel region near the shielded trenched gate, and has junction depth near edge of the trenched source-body contact greater than near the adjacent channel region.

According to another aspect, in some preferred embodiments, the first conductivity type is N type and the second conductivity type is P type. In some other preferred embodiments, the first conductivity type is P type while the second conductivity type is N type.

Preferred embodiments include one or more of the following features: the first type gate oxide has thickness greater than the second type gate oxide; the trench MOSFET further comprises at least one first type wide trenched gate filled with the single shielded electrode padded by the first type gate oxide, and extended from the shielded trenched gates for connection of the shielded electrode to the source metal; the shielded trenched gates further extend to at least one second type wider trenched gate for connection of the gate electrode to the gate metal, wherein the second type wider trenched gate has the same dual electrodes structure as the shielded trenched gates in the active area but with a greater width; the trench MOSFET further comprises a plurality of trenched source-body contacts with each filled with a metal plug, penetrating through the insulation layer, the source regions and extending into the first type body regions, wherein the metal plug is padded by a barrier layer of Ti/TiN or Co/TiN or Ta/TiN, and contacting with the source metal; the trench MOSFET further comprises at least a trenched gate electrode contact with each filled with a metal plug, penetrating through the insulation layer and extending into the gate electrode in the second type wider trenched gate for gate electrode connection, wherein the metal plug is padded by a barrier layer of Ti/TiN or Co/TiN or Ta/TiN, and contacting with the gate metal; the trench MOSFET further comprises at least a trenched shielded electrode contact with each fill with a metal plug, penetrating through the insulation layer and extending into the single shielded electrode in the first type wider trenched gate for shielded electrode contact, wherein the metal plug is padded by a barrier layer of Ti/TiN or Co/TiN or Ta/TiN, and contacting with the source metal; the trench MOSFET further comprises a body contact region of the second conductivity type within the first type body region and underneath each of the trenched source-body contact, the body contact region has a higher doping concentration than the first type body region to further reduce the resistance between the trenched source-body contact and the first type body region.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
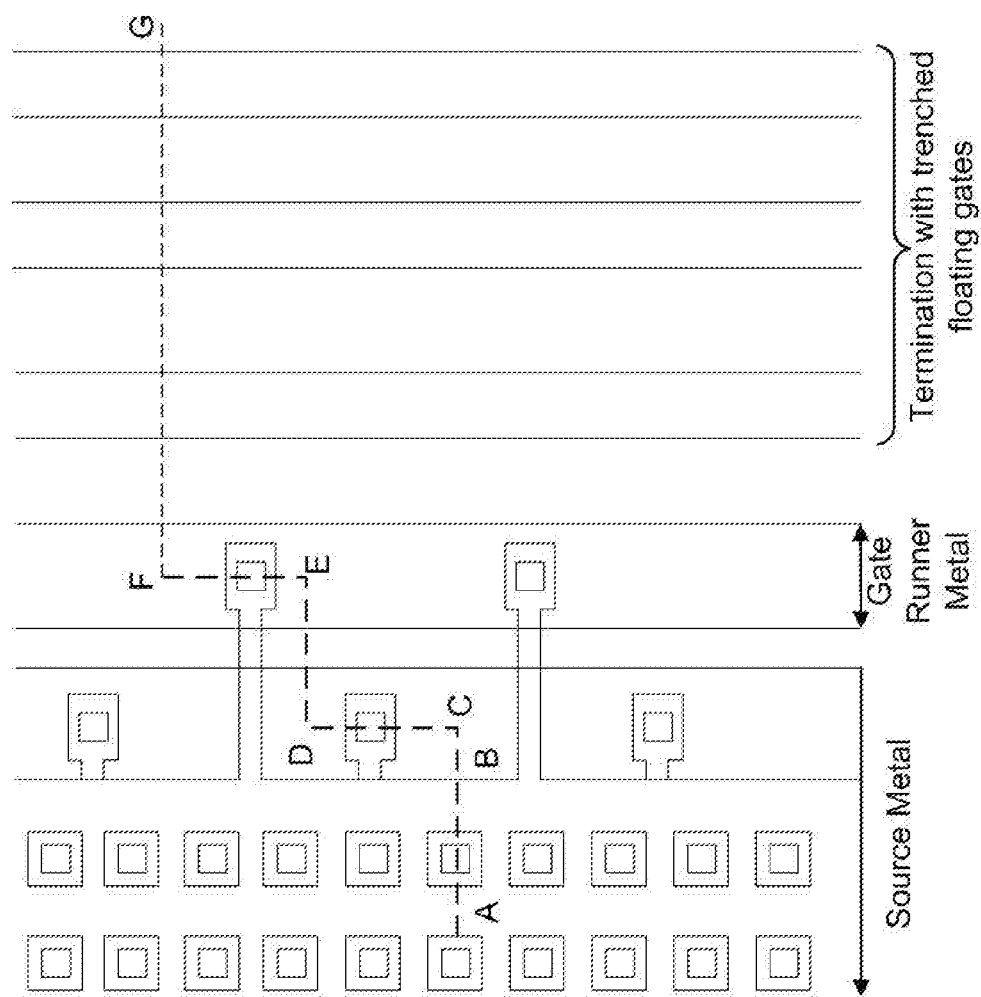
FIG. 1A is top view of a trench MOSFET in prior art.
Figure 1B:
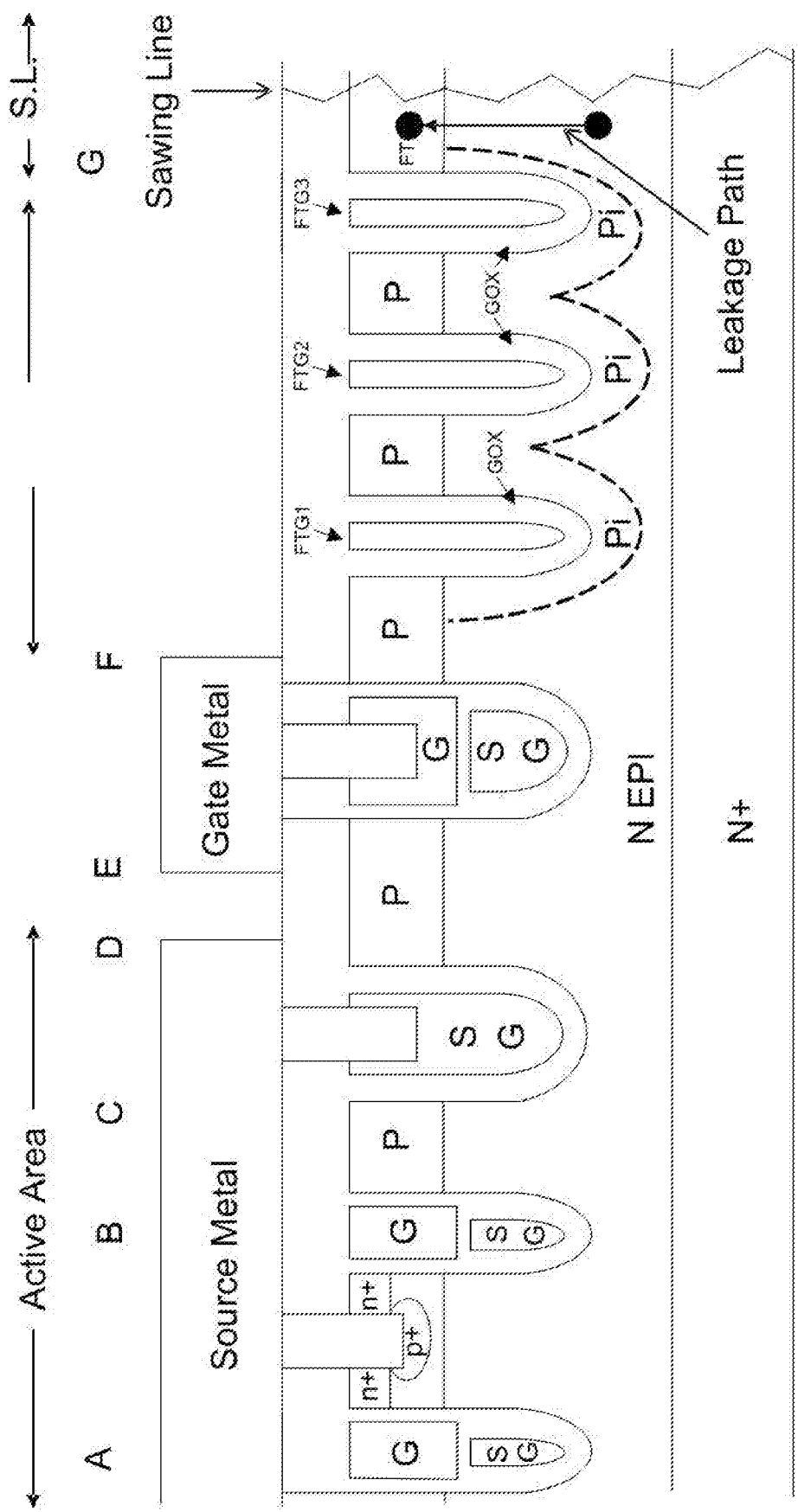
FIG. 1B is a cross-sectional view of the trench MOSFET in FIG. 1A.
Figure 2A:
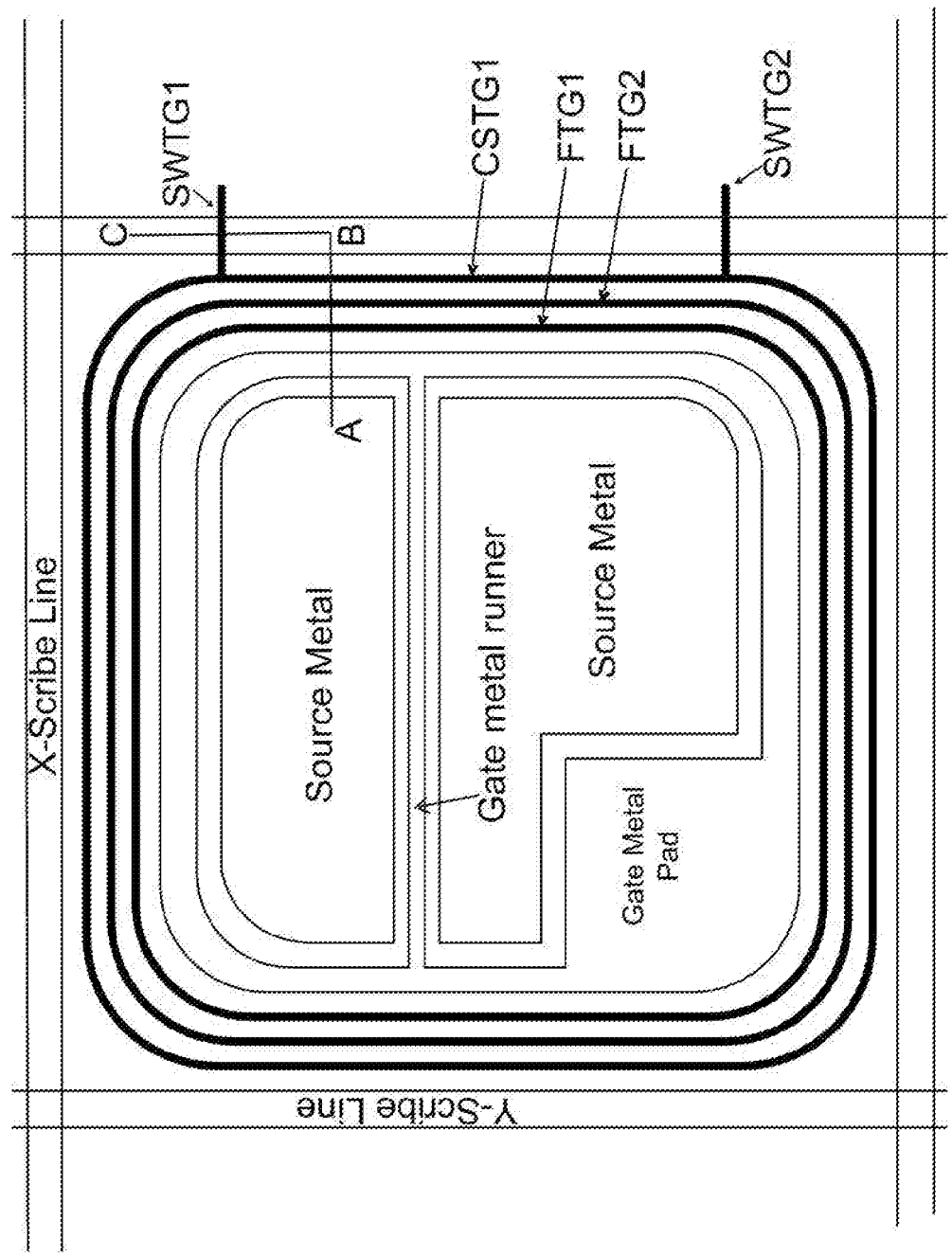
FIG. 2A is a layout structure of a preferred embodiment according to the present invention.

Please refer to FIG. 2A for a preferred trench MOSFET layout of this invention wherein an termination area surrounding outsider of an area underneath source metal, gate metal pad and gate metal runner, comprises multiple floating trenched gates and at least one channel stop trenched gate, for example, two floating trenched gates (FTG1 and FTG2) and one channel stop trenched gate (CSTG1) in this embodiment. Meanwhile, the channel stop trenched gate CSTG1 is further connected to two sawing trenched gates SWTG1 and SWTG2 cross a Y scribe line (in Y direction). After die sawing, the sawing trenched gates SWTG1, SWTG2 and the channel stop trenched gate CSTG1 are electrically shorted at scribe line to drain region and body region for prevention of the leakage path formation as discussed above.

Figure 2B:
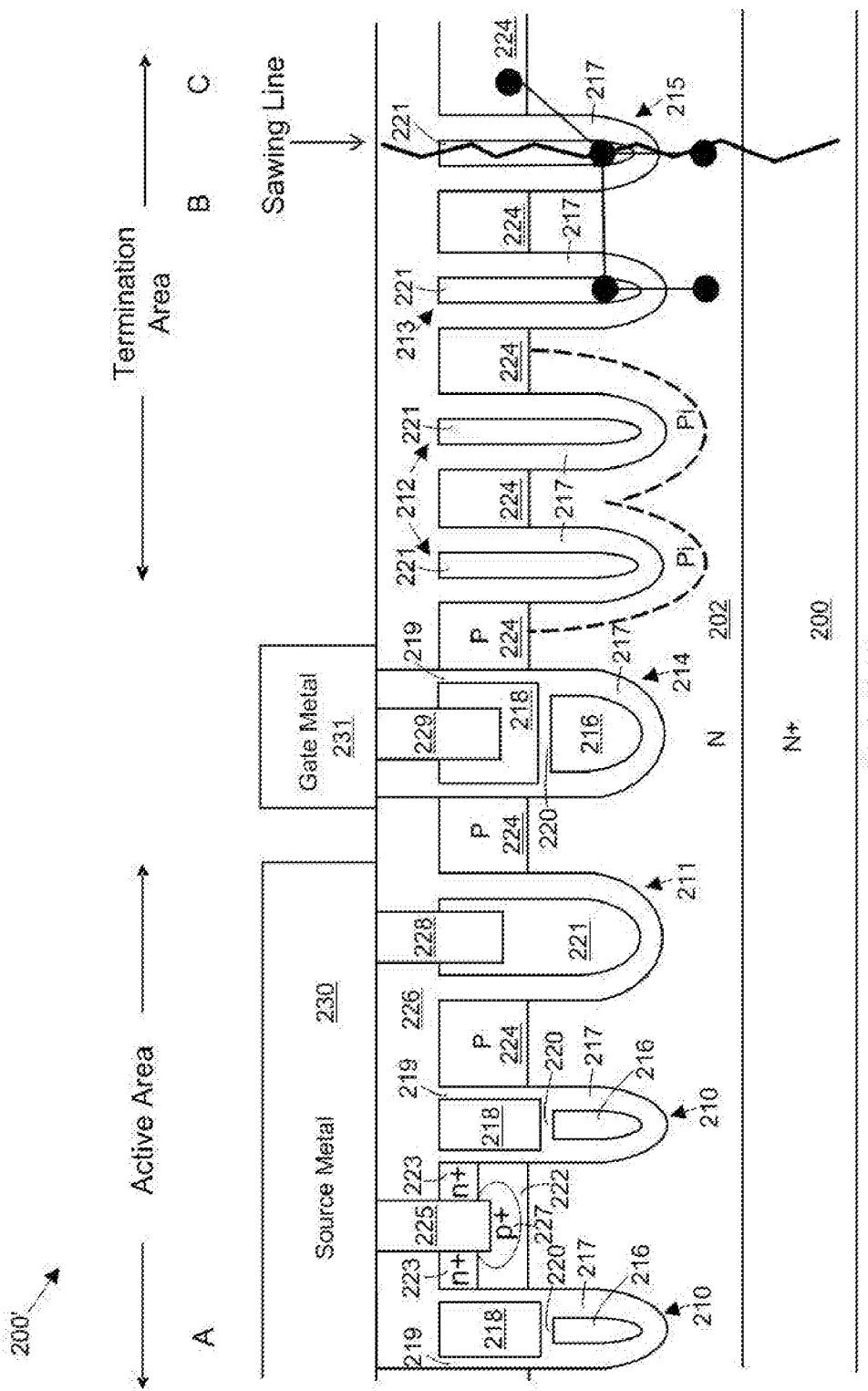
FIG. 2B is a cross-sectional view of a preferred embodiment according to the present invention, which is also a preferred A-B-C cross section of FIG. 1A.

Please refer to FIG. 2B for a preferred embodiment of this invention which is also a preferred A-B-C cross section of FIG. 2A, wherein an N-channel trench MOSFET 200' is formed in an N epitaxial layer 202 onto an N+ substrate 200 with a metal layer on rear side as drain. Inside the N epitaxial layer 202, a plurality of shielded trenched gates 210 and at least one first type trenched gate 211 for shielded electrode contact are formed in an active area, multiple floating trenched gates 212 and at least one channel stop trenched gate 213 are formed in the termination are, at least one second type wide trenched gate 214 for gate contact is formed underneath the gate metal between the active area and the termination area, and at least one sawing trenched gate 215 is formed cross a scribe line. Among those trenched gates according to this embodiment, the shielded trenched gates 210 and the second type wide trenched gate 214 are each implemented by comprising a shielded electrode 216 padded by a first type gate oxide 217 in a lower portion and a gate electrode 218 padded by a second type gate oxide 219 in an upper portion, wherein the gate electrode 218 and the shielded electrode 216 are insulated from each other by an inter-electrode insulation layer 220. Meanwhile, the other trenched gates are each implemented by comprising a single shielded electrode 221 padded by the first type gate oxide 217. In an upper portion of the N epitaxial layer 202, a plurality of first type P body regions 222 having n+ source regions 223 whereon are extending between two adjacent of the gate electrodes 218 in the active area; and a plurality of second type P body regions 224 without having source regions whereon are formed around outside of the active area including the termination area. What should be noticed is that, the multiple trenched gates 212 each has trench depth equal to or deeper than junction depth of the second type P body regions 224 to maintain breakdown voltage while preventing heavy leakage current. The N-channel trench MOSFET 200' further comprises: a plurality of trenched source-body contacts each filled with a metal plug 225, penetrating through an insulation layer 226, the n+ source regions 223 and extending into the first type P body regions 222, wherein the meal plug 225 is surrounded by a p+ body contact region 227 around its bottom to further reduce the contact resistance; at least a trenched shielded electrode contact filled with a metal pug 228, penetrating through the insulation layer 226 and extending into the single shielded electrode 221 in the first type wider trenched gate 211; at least a trenched gate electrode contact filled with a metal pug 229, penetrating through the insulation layer 226 and extending into the gate electrode 216 in the second type wider trenched gate 214; The N-channel trench MOSFET 200' further comprises a source metal pad 230 and a gate metal 231 (which is a gate metal pad or gate metal runner connecting to the gate metal pad), the source metal pad 230 is connected to the n+ source regions 223, the first type P body regions 222 via the metal plug 225 filled in the trenched source-body contact, and is also connected to the shielded electrodes in the active area via the metal plug 228 filled in the trenched shielded electrode contact, the gate metal 231 is connected to the gate electrode 216 in the at least one second type wider trenched gate 214 via the metal plug 229 filled in the trenched gate contact for gate contact, wherein each of the metal plugs 225, 228 and 229 can be implemented by using a tungsten metal plug padded by a barrier layer of Ti/TiN or Co/TiN or Ta/TiN. Since the structure does not have n+ source regions between two adjacent trenched floating gates 212, no current will flow from drain region through channel region to the source regions in the active area even the trenched floating gates 212 are turned on. Meanwhile, the at least one channel stop trenched gate 213 is connecting to the at least one sawing trenched gate 215, wherein the sawing trenched gate 215 is sawed in the Y-scribe line to ensure that the sawing trenched gate 215 and the channel stop trenched gate 213 are both electrically shorted to the N epitaxial layer 202 and to the second type body regions 224 surrounding the sawing trenched gate 215 (illustrated by the black dots connected by lines in FIG. 2B). Because the channel stop trenched gate 213 is electrically shorted to the N epitaxial layer 202, there is no channeling region Pi formed surrounding the channel stop trenched gate 213 below the second type P body region 224, therefore, the channel stop trenched gate 213 is acted to stop the channeling region for prevention of leakage path formation between the drain region and the source region. Besides, the multiple trenched floating gates 212 and the second type P body regions 224 all have floating voltage.

Figure 2C:
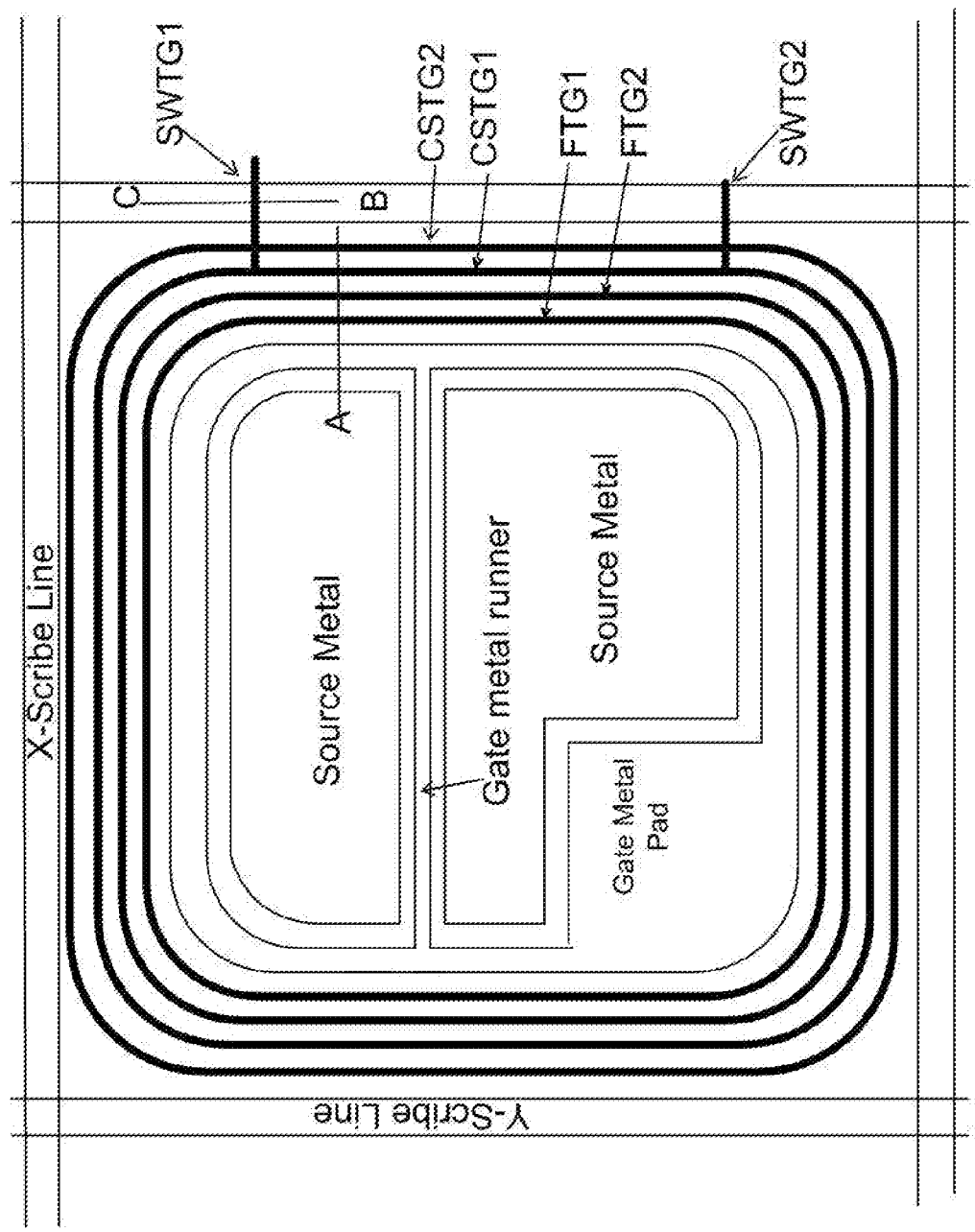
FIG. 2C is a layout structure of a preferred embodiment according to the present invention.

Please refer to FIG. 2C for another preferred trench MOSFET layout of this invention. Compared to FIG. 2A, the termination area comprises two floating trenched gates (FTG1 and FTG2) and two channel stop trenched gates (CSTG1 and CSTG2) in this embodiment.

Figure 3A:
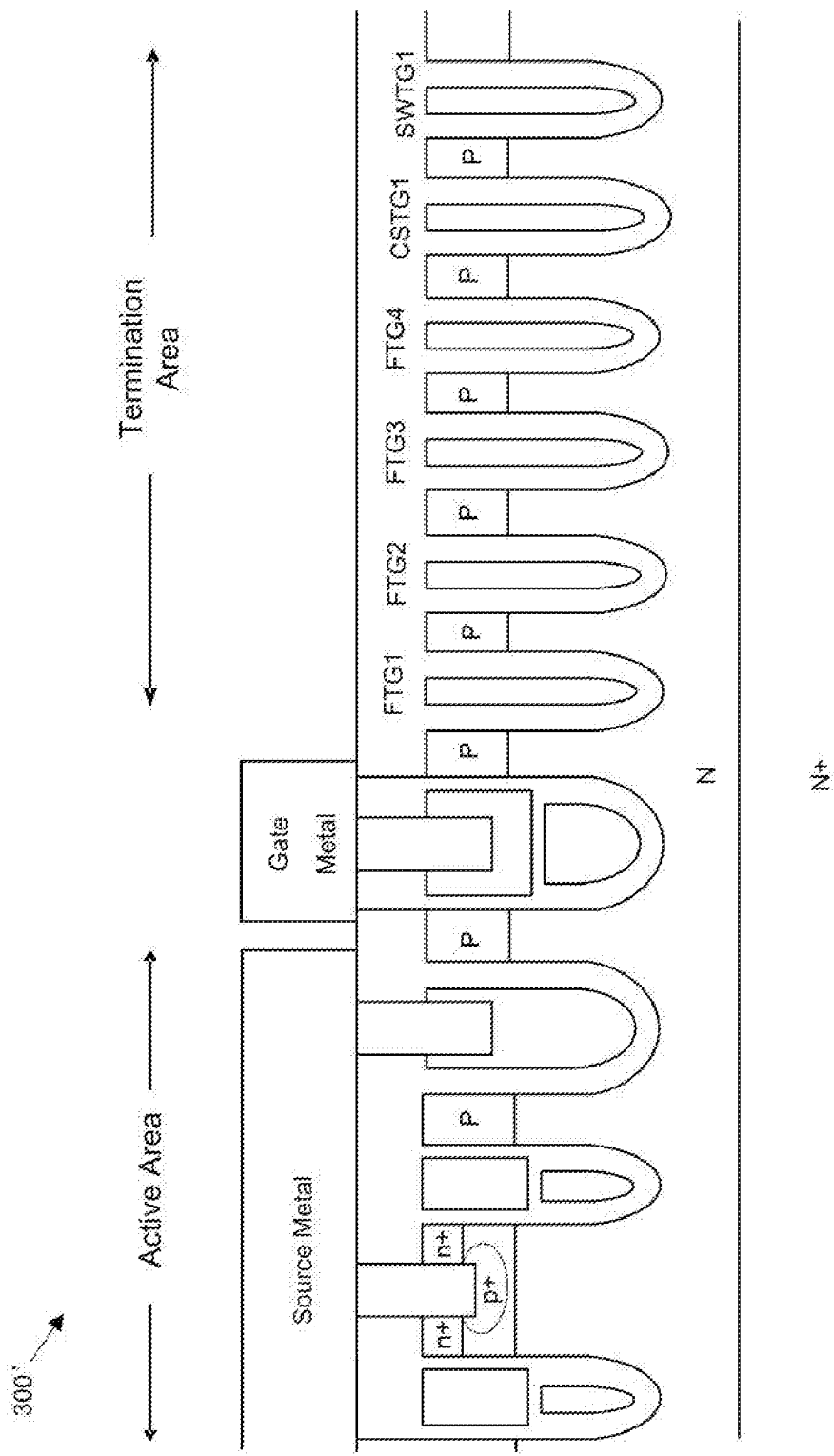
FIG. 3A is a cross-sectional view of another preferred embodiment according to the present invention.

Please refer to FIG. 3A for another preferred trench MOSFET 300' of this invention. Compared to FIG. 2B, the termination area in trench MOSFET 300' comprises four floating trenched gates (FTG1, FTG2, FTG3 and FTG4) and one channel stop trenched gate (CSTG1), and all the trenched gates in termination area including the sawing trenched gate SWTG1 are implemented by using single shielded electrode structure.

Figure 3B:
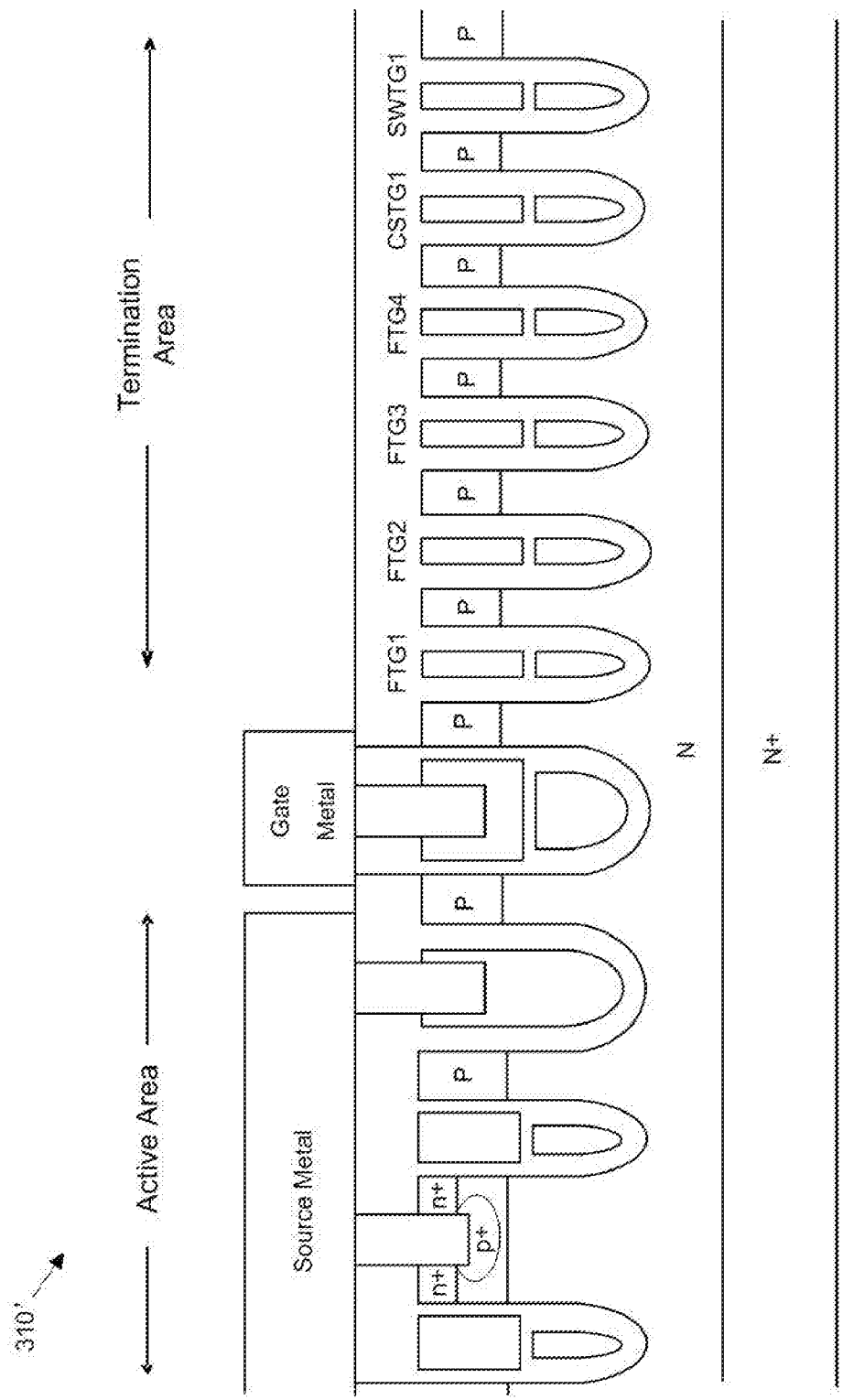
FIG. 3B is a cross-sectional view of another preferred embodiment according to the present invention.

Please refer to FIG. 3B for another preferred trench MOSFET 310' of this invention. Compared to FIG. 3A, the termination area in trench MOSFET 310' comprises four floating trenched gates (FTG1, FTG2, FTG3 and FTG4) and one channel stop trenched gate (CSTG1), and all the trenched gates in termination area including the sawing trenched gate SWTG1 are implemented by using double electrodes structure which comprises a gate electrode in upper portion and a shielded electrode in lower portion.

Figure 3C:
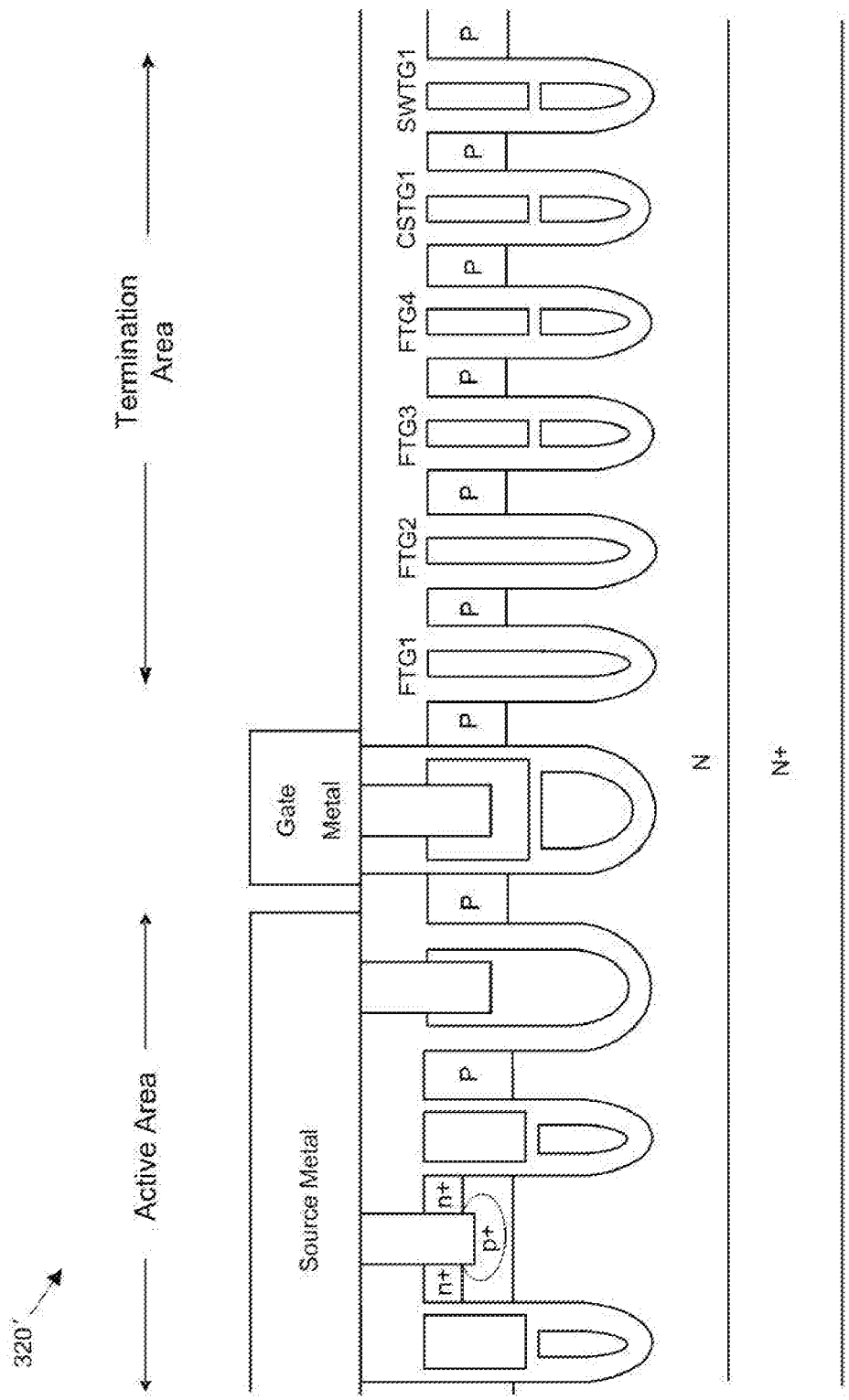
FIG. 3C is a cross-sectional view of another preferred embodiment according to the present invention.

Please refer to FIG. 3C for another preferred trench MOSFET 320' of this invention. Compared to FIG. 3B, the termination area in trench MOSFET 320' comprises four floating trenched gates (FTG1, FTG2, FTG3 and FTG4) and one channel stop trenched gate (CSTG1). Some of the floating trenched gates (two in this embodiment) near active area are implemented by using single shielded electrode structure, and the rest trenched gates including the sawing trenched gate SWTG1 are implemented by using double electrodes structure which comprises a gate electrode in upper portion and a shielded electrode in lower portion.

Figure 3D:
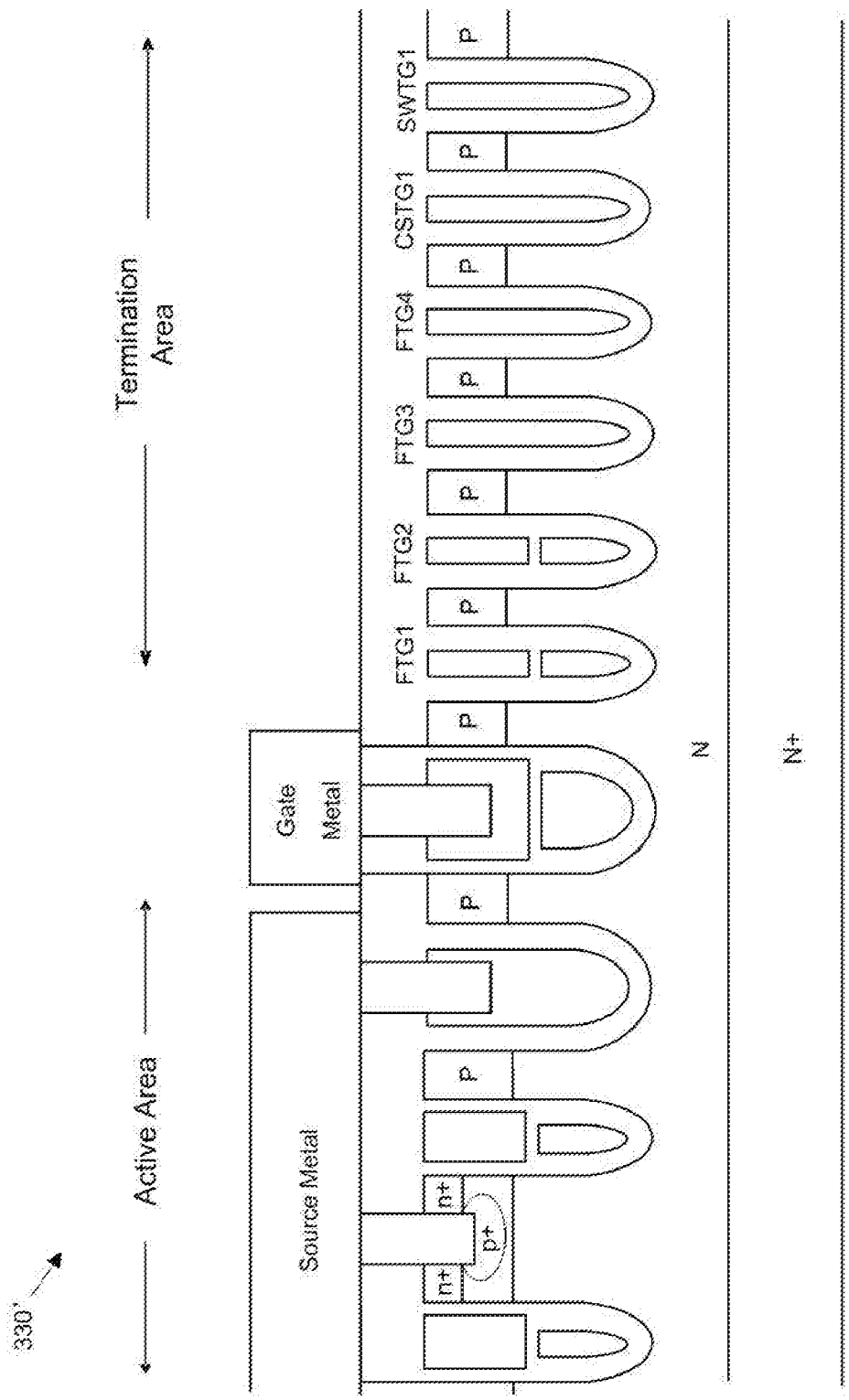
FIG. 3D is a cross-sectional view of another preferred embodiment according to the present invention.

Please refer to FIG. 3D for another preferred trench MOSFET 330' of this invention. Compared to FIG. 3B, the termination area in trench MOSFET 330' comprises four floating trenched gates (FTG1, FTG2, FTG3 and FTG4) and one channel stop trenched gate (CSTG1). Some of the floating trenched gates (two in this embodiment) near active area are implemented by using double electrodes structure which comprises a gate electrode in upper portion and a shielded electrode in lower portion, and the rest trenched gates including the sawing trenched gate SWTG1 are implemented by using single shielded electrode structure.

Figure 4A:
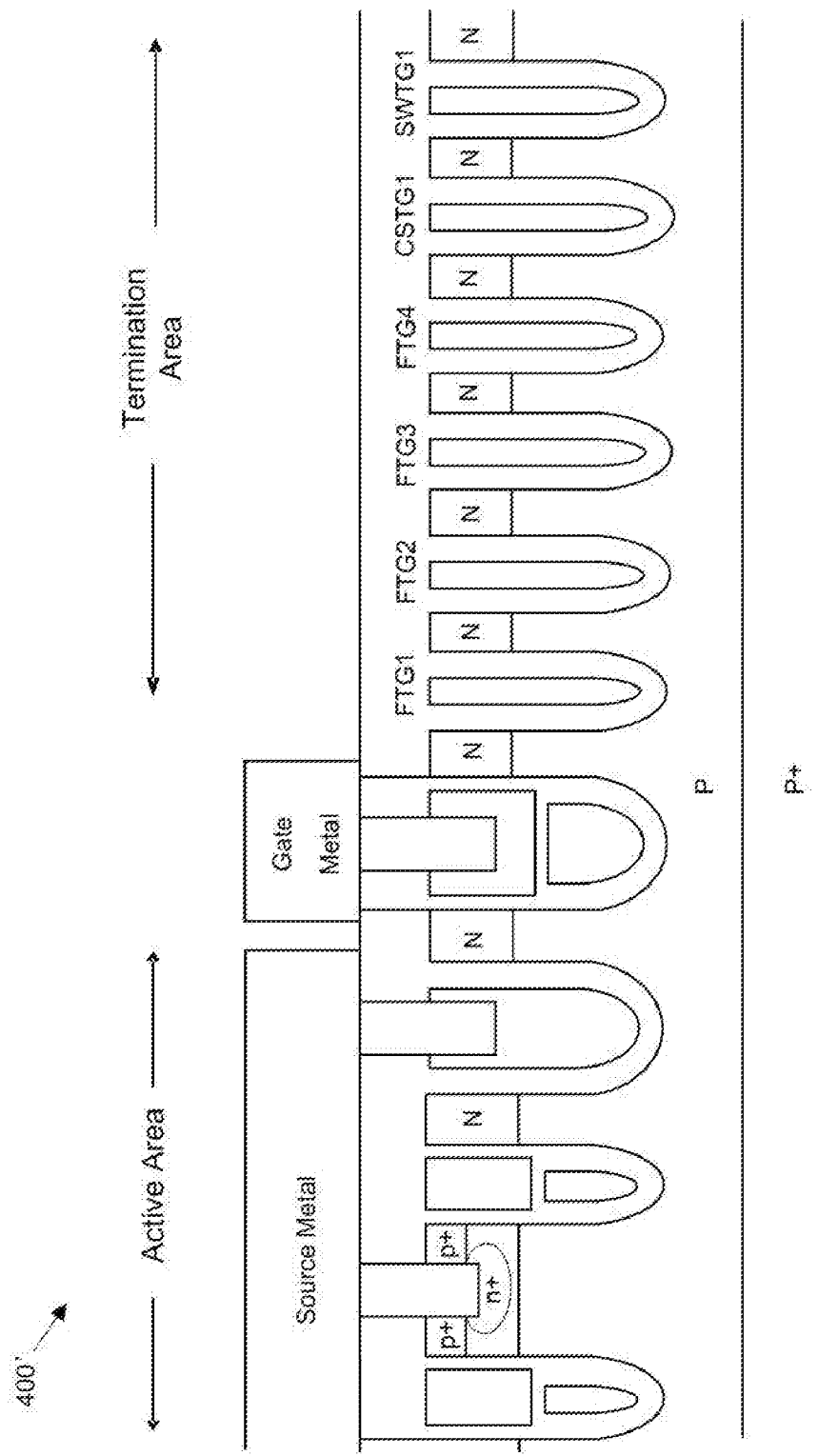
FIG. 4A is a cross-sectional view of another preferred embodiment according to the present invention.

Please refer to FIG. 4A for another preferred trench MOSFET 400' of this invention. Compared to FIG. 3A, trench MOSFET 400' is a P type trench MOSFET formed in P type epitaxial layer.

Figure 4B:
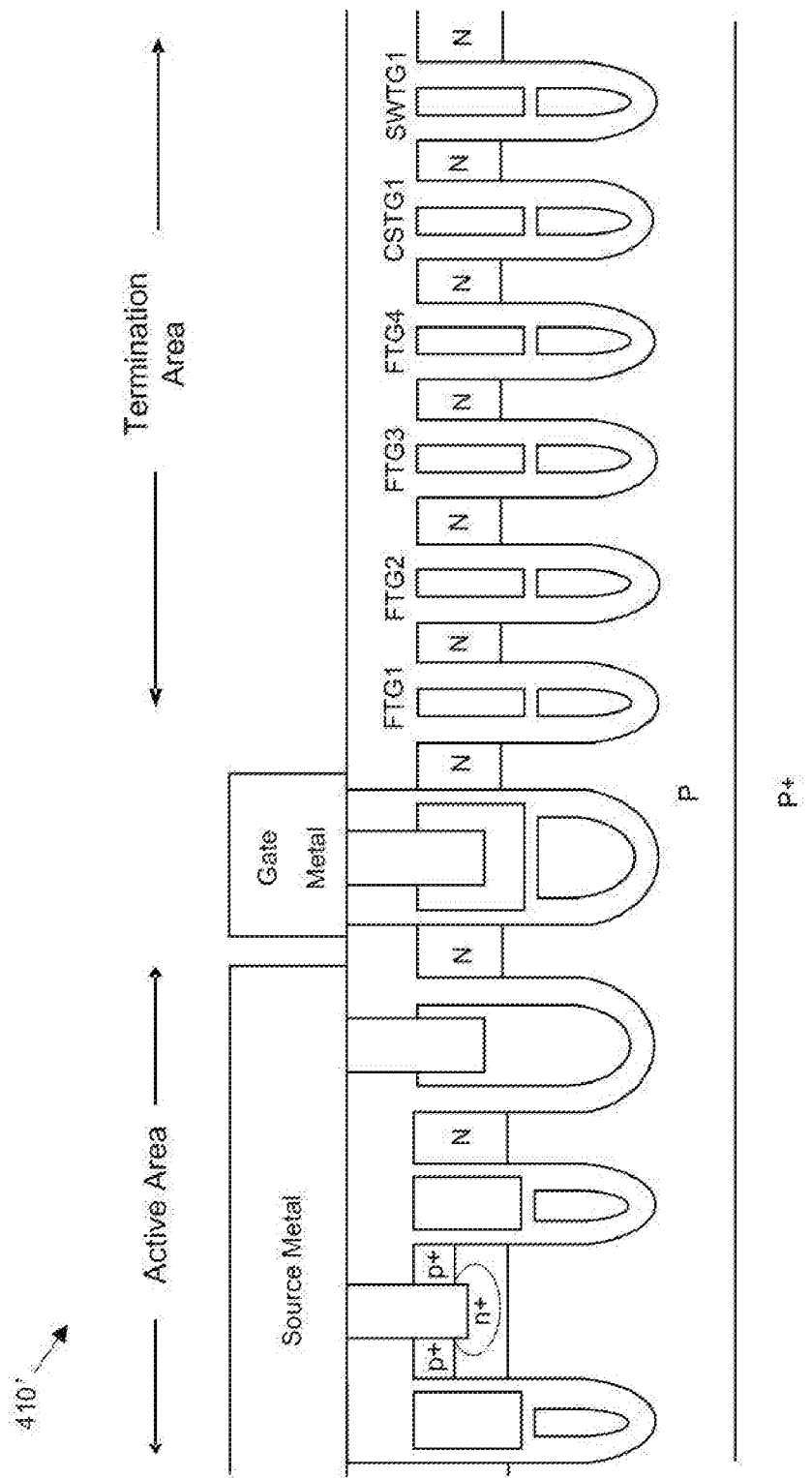
FIG. 4B is a cross-sectional view of another preferred embodiment according to the present invention.

Please refer to FIG. 4B for another preferred trench MOSFET 410' of this invention. Compared to FIG. 3B, trench MOSFET 410' is a P type trench MOSFET formed in P type epitaxial layer.

Figure 4C:
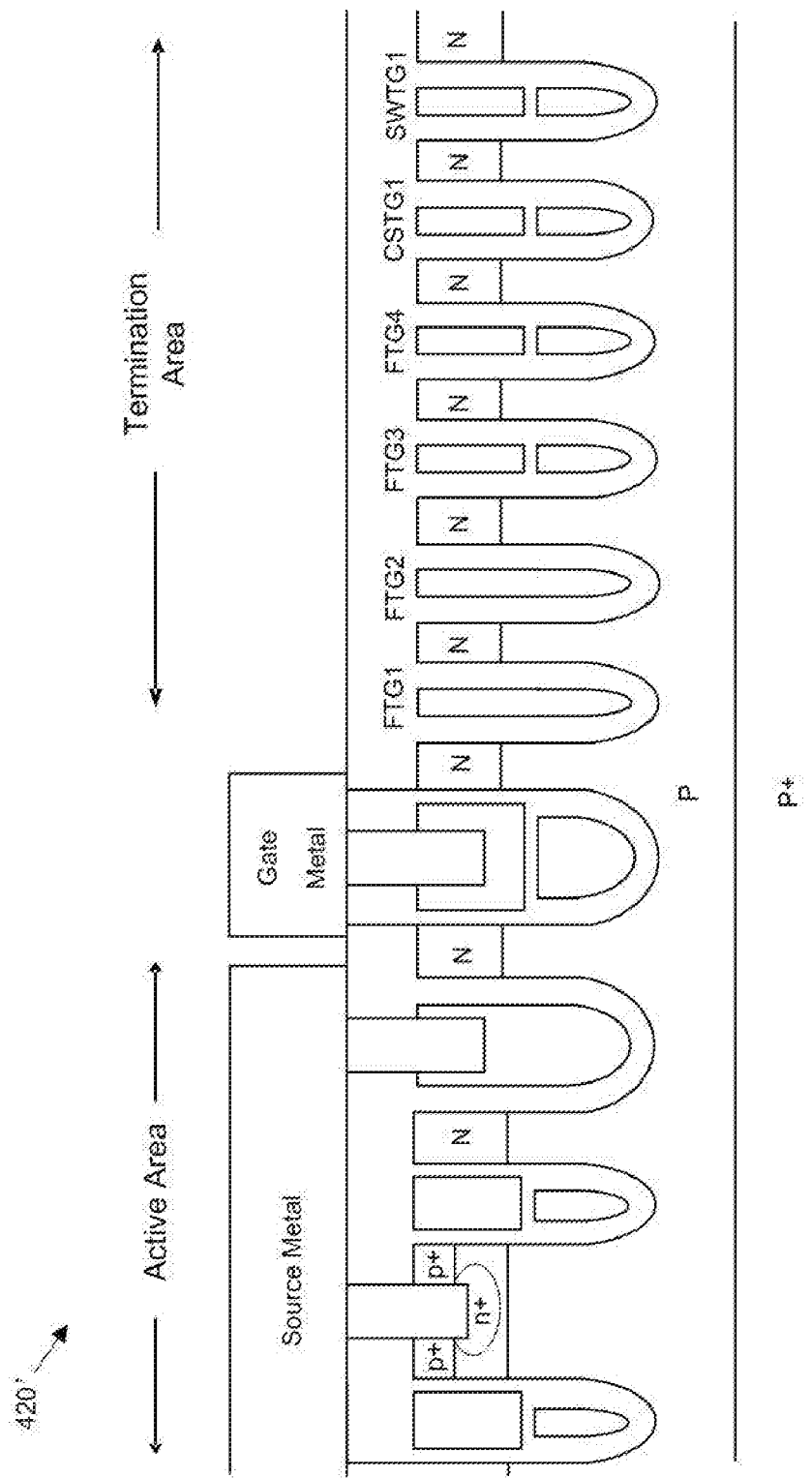
FIG. 4C is a cross-sectional view of another preferred embodiment according to the present invention.

Please refer to FIG. 4C for another preferred trench MOSFET 420' of this invention. Compared to FIG. 3C, trench MOSFET 420' is a P type trench MOSFET formed in P type epitaxial layer.

Figure 4D:
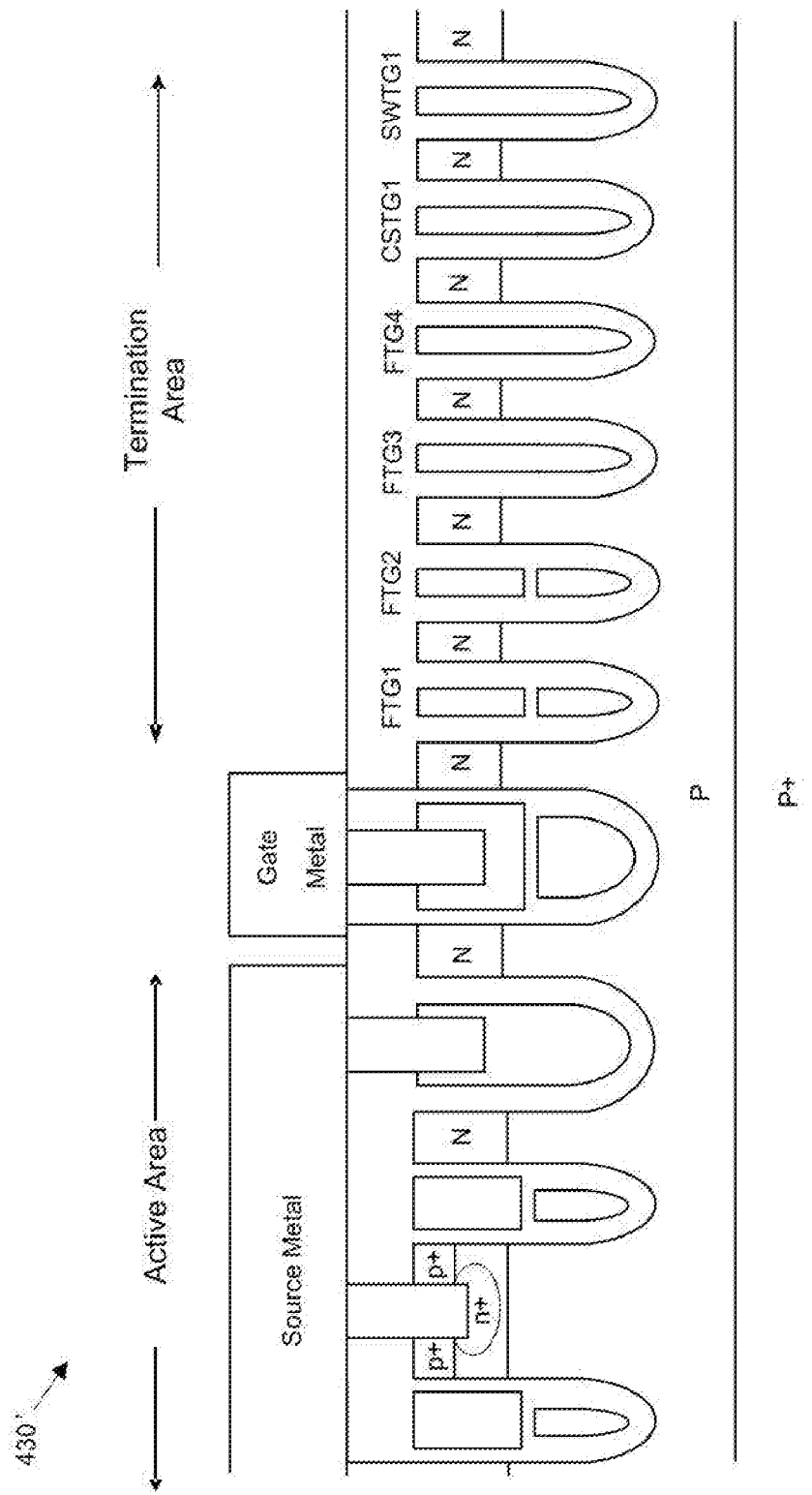
FIG. 4D is a cross-sectional view of another preferred embodiment according to the present invention.

Please refer to FIG. 4D for another preferred trench MOSFET 430' of this invention. Compared to FIG. 3D, trench MOSFET 430' is a P type trench MOSFET formed in P type epitaxial layer.

Figure 5A:
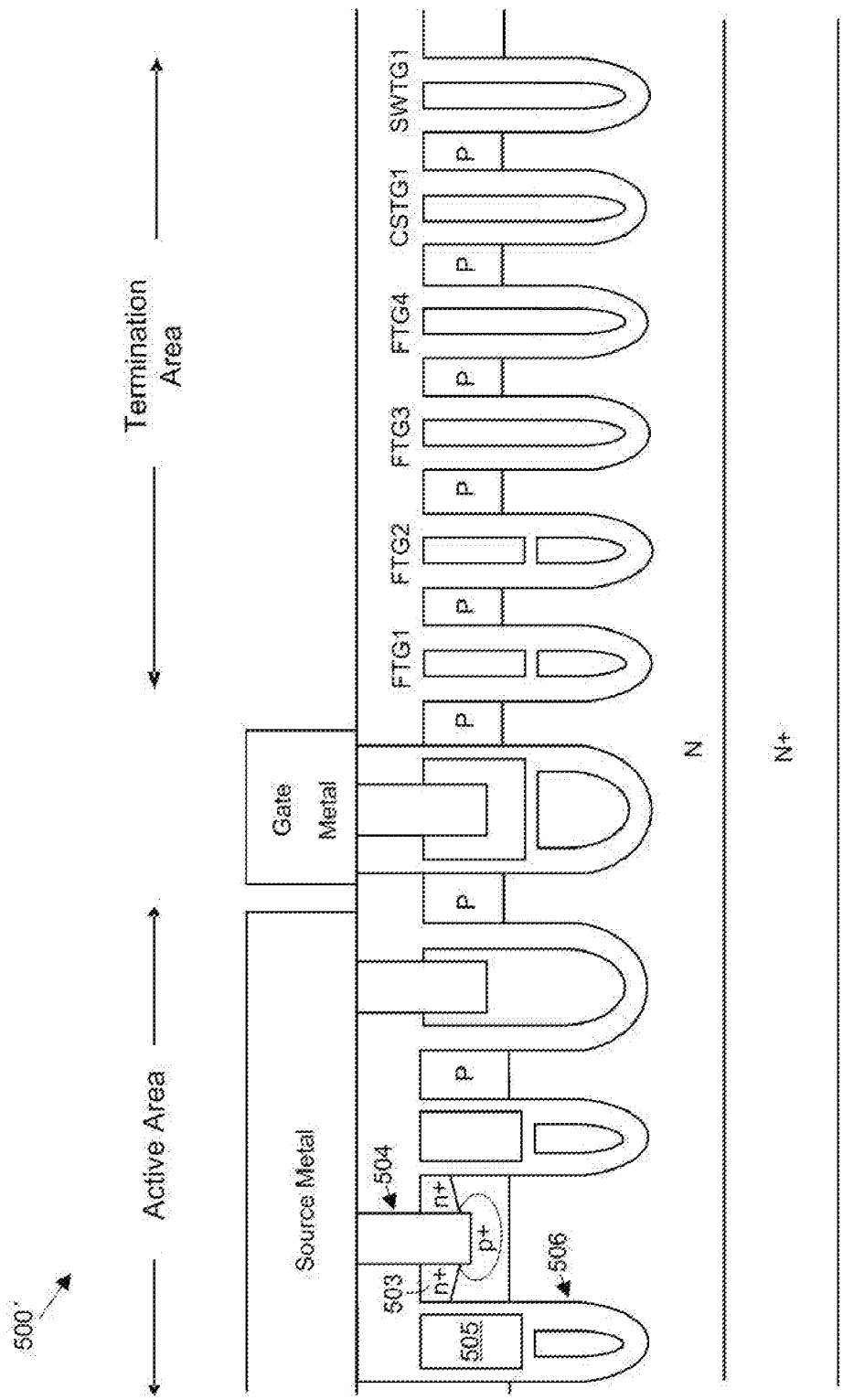
FIG. 5A is a cross-sectional view of another preferred embodiment according to the present invention.

Please refer to FIG. 5A for another preferred trench MOSFET 500' of this invention. Compared to FIG. 3D, the n+ source region 503 in the trench MOSFET 500' has a doping concentration of Gaussian-distribution from edge of a trenched source-body contact 504 to an adjacent channel region near the gate electrode 505 near the shielded trenched gate 506, and has junction depth near edge of the trenched source-body contact 504 greater than near the adjacent channel region.

Figure 5B:
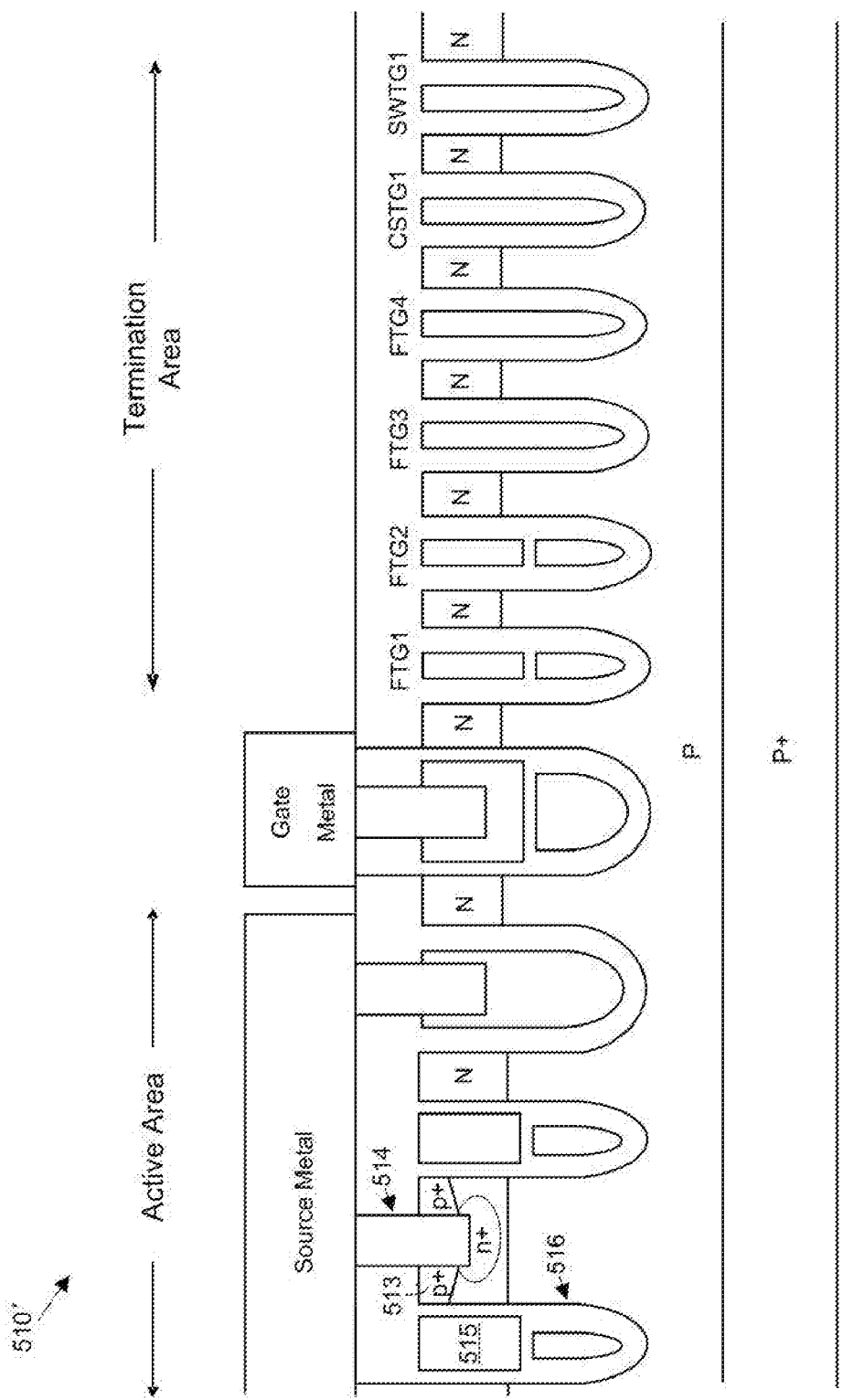
FIG. 5B is a cross-sectional view of another preferred embodiment according to the present invention.

Please refer to FIG. 5B for another preferred trench MOSFET 510' of this invention. Compared to FIG. 4D, the p+ source region 513 in the trench MOSFET 510' has a doping concentration of Gaussian-distribution from edge of a trenched source-body contact 514 to an adjacent channel region near the gate electrode 515 near the shielded trenched gate 516, and has junction depth near edge of the trenched source-body contact 514 greater than near the adjacent channel region.

Figure 6A:
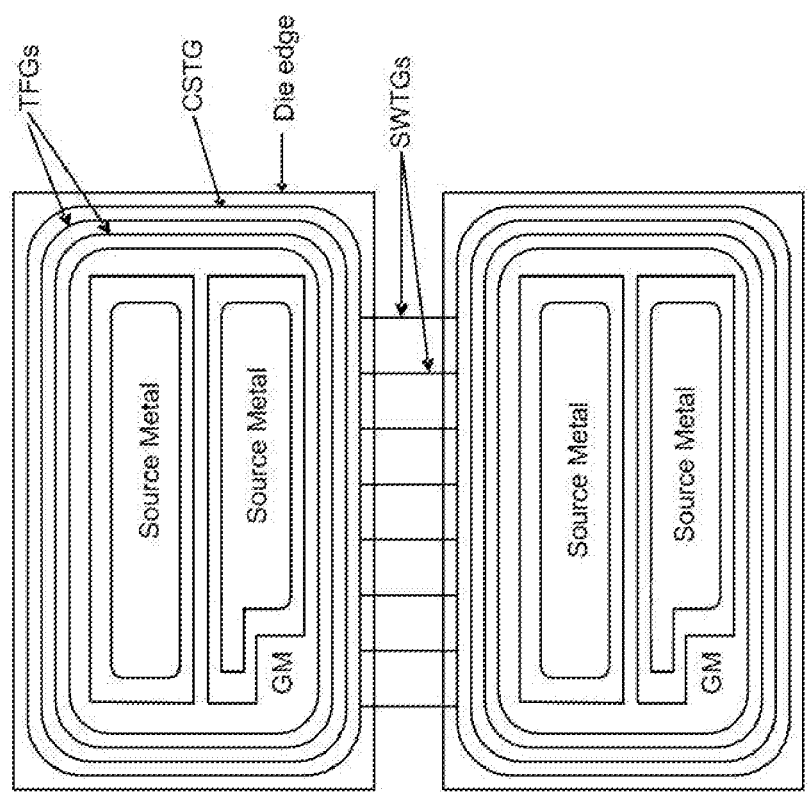
FIG. 6A is a dual dies layout of a preferred embodiment according to the present invention.
Figure 6B:
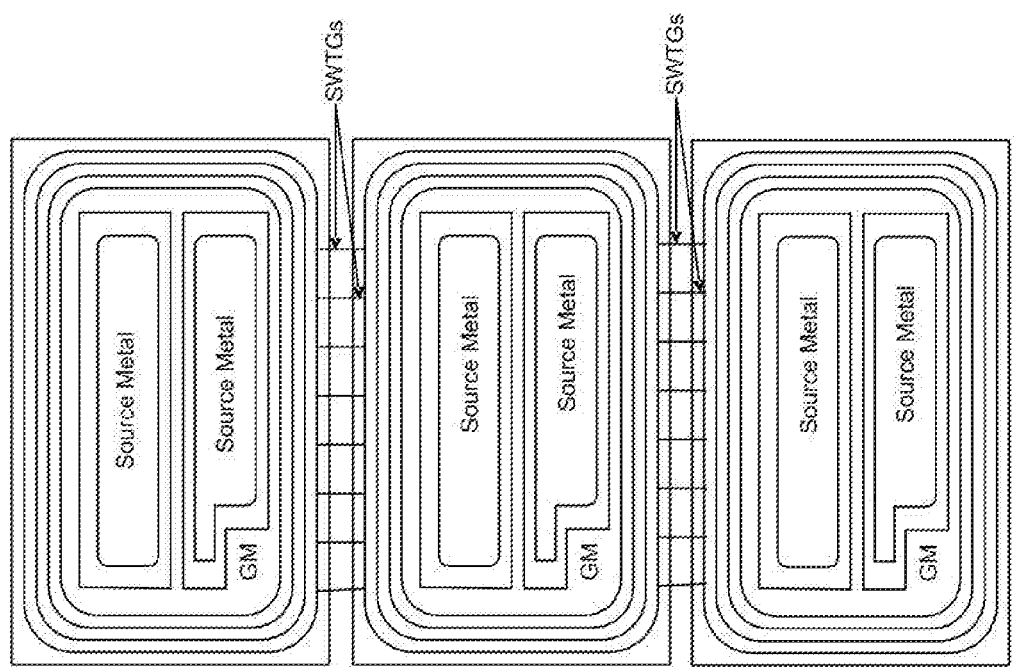
FIG. 6B is a three dies layout of a preferred embodiment according to the present invention.
Figure 6C:
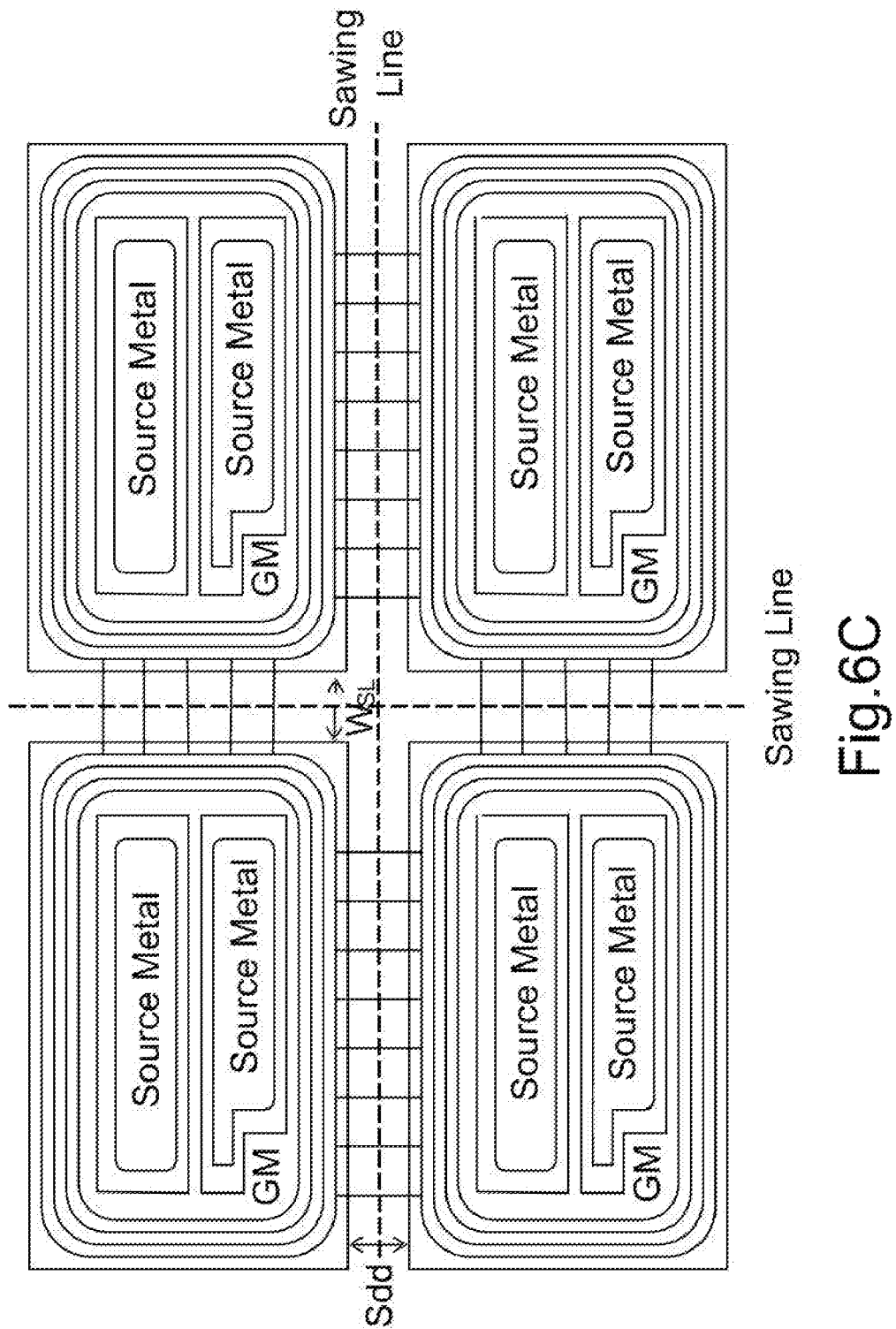
FIG. 6C is a four dies layout of a preferred embodiment according to the present invention.

Please refer to FIG. 6A for a preferred trench MOSFET layout structure composed of dual dies layout, wherein dies are connected together with multiple sawing trenched gates (SWTGs, as illustrated), what should be noticed is that, die to die space (Sdd, as illustrated in FIG. 6C) is same as the scribe line width ($W_{SL}$, a illustrated in FIG. 6C), which makes it happen to achieve a feasible trench MOSFET with the invented structure.

Please refer to FIG. 6B for a preferred trench MOSFET layout structure composed of three dies layout, wherein dies are connected together with multiple sawing trenched gates (SWTGs, as illustrated), what should be noticed is that, die to die space (Sdd, as illustrated in FIG. 6C) is same as the scribe line width ($W_{SL}$, a illustrated in FIG. 6C), which makes it happen to achieve a feasible trench MOSFET with the invented structure.

Please refer to FIG. 6C for a preferred trench MOSFET layout structure composed of four dies layout, wherein dies are connected to each other with multiple sawing trenched gates (SWTGs, as illustrated), what should be noticed is that, die to die space (Sdd, as illustrated) is same as the scribe line width ($W_{SL}$, a illustrated), which makes it happen to achieve a feasible trench MOSFET with the invented structure.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device layout consisted of multiple trench MOSFETs with each trench MOSFETs comprising:

multiple floating trenched gates formed in parallel in a termination area around outside of an active area, said multiple floating trenched gates having floating voltage and surrounded by body regions without having source regions, said multiple trenched floating gates having trench depth equal to or deeper than junction depth of said body regions;

at least one channel stop trenched gate formed in said termination area and around outside of said multiple floating trenched gates, each said trenched channel stop gate being connected to at least one sawing trenched gate, each said sawing trenched gate being extended across over a scribe line;

each of said trench MOSFETs further comprising:

a substrate of a first conductivity type;

an epitaxial layer of said first conductivity type grown on said substrate, wherein said epitaxial layer having a lower doping concentration than said substrate;

a plurality of said source regions of said first conductivity type formed near top surface of said epitaxial layer only within said active area;

a plurality of first type body regions of a second conductivity type formed underneath said source regions in said active area;

a plurality of second type body regions of a second conductivity type formed in said epitaxial layer from top surface of said epitaxial layer around outside of said active area including said termination area;

said source regions being not disposed in the top of said second type body regions;

a plurality of shielded trenched gates in said active area, wherein each said shielded trenched gate having dual gate electrodes comprising a gate electrode disposed in the upper portion and a shielded electrode disposed in the lower portion, wherein said gate electrode and said shielded electrode insulated from each other by an inter-electrode insulation layer;

said gate electrode in said shielded trenched gates connected to a gate metal formed over said insulation layer and said shielded electrode in said shielded trenched gates connected to a source metal formed over said insulation layer;

each said shielded trenched gate in said active area further comprises a first type gate oxide layer surrounding bottom and sidewalls of said shielded electrode, and a second type gate oxide along sidewalls of said gate electrode;

multiple floating trenched gates having floating voltage in parallel formed in termination area around outside of said active area and surrounded by said second type body regions and extending into said epitaxial layer, said floating trenched gates having trench depth equal to or deeper than junction depth of said second type body regions;

each said second type body region between two adjacent of said floating trenched gates in said termination area having floating voltage;

at least one channel stop trenched gate formed in said termination area and around outside of said multiple floating trenched gates, each said channel stop trenched gate being connected to at least one sawing trenched gate, wherein each said sawing trenched gate being extended across a scribe line; and a drain metal on rear side of said substrate wherein each of said multiple floating trenched gates in said termination area has said dual gate electrodes same as in said active area.

2. The semiconductor power device layout of claim 1 wherein said at least one channel stop trenched gate and said at least one sawing trenched gate are shorted with a drain region after die sawing through said at least one sawing trenched gate for separation of adjacent said trench MOSFETs.

3. The semiconductor power device of claim 1 being consisted of two said trench MOSFETs.

4. The semiconductor power device of claim 1 being consisted of three said trench MOSFETs.

5. The semiconductor power device of claim 1 being consisted of four said trench MOSFETs.

6. A semiconductor power device layout consisted of multiple trench MOSFETs with each trench MOSFETs comprising:

multiple floating trenched gates formed in parallel in a termination area around outside of an active area, said multiple floating trenched gates having floating voltage and surrounded by body regions without having source regions, said multiple trenched floating gates having trench depth equal to or deeper than junction depth of said body regions;

at least one channel stop trenched gate formed in said termination area and around outside of said multiple floating trenched gates, each said trenched channel stop gate being connected to at least one sawing trenched gate, each said sawing trenched gate being extended across over a scribe line;

each of said trench MOSFETs further comprising:

a substrate of a first conductivity type;

an epitaxial layer of said first conductivity type grown on said substrate, wherein said epitaxial layer having a lower doping concentration than said substrate;

a plurality of said source regions of said first conductivity type formed near top surface of said epitaxial layer only within said active area;

a plurality of first type body regions of a second conductivity type formed underneath said source regions in said active area;

a plurality of second type body regions of a second conductivity type formed in said epitaxial layer from top surface of said epitaxial layer around outside of said active area including said termination area;

said source regions being not disposed in the top of said second type body regions;

a plurality of shielded trenched gates in said active area, wherein each said shielded trenched gate having dual gate electrodes comprising a gate electrode disposed in the upper portion and a shielded electrode disposed in the lower portion, wherein said gate electrode and said shielded electrode insulated from each other by an inter-electrode insulation layer;

said gate electrode in said shielded trenched gates connected to a gate metal formed over said insulation layer and said shielded electrode in said shielded trenched gates connected to a source metal formed over said insulation layer;

each said shielded trenched gate in said active area further comprises a first type gate oxide layer surrounding bottom and sidewalls of said shielded electrode, and a second type gate oxide along sidewalls of said gate electrode;

multiple floating trenched gates having floating voltage in parallel formed in termination area around outside of said active area and surrounded by said second type body regions and extending into said epitaxial layer, said floating trenched gates having trench depth equal to or deeper than junction depth of said second type body regions;

each said second type body region between two adjacent of said floating trenched gates in said termination area having floating voltage;

at least one channel stop trenched gate formed in said termination area and around outside of said multiple floating trenched gates, each said channel stop trenched gate being connected to at least one sawing trenched gate, wherein each said sawing trenched gate being extended across a scribe line; and a drain metal on rear side of said substrate wherein said channel stop trenched gate has said dual gate electrodes same as in active area.

7. A semiconductor power device layout consisted of multiple trench MOSFETs with each trench MOSFETs comprising:

multiple floating trenched gates formed in parallel in a termination area around outside of an active area, said multiple floating trenched gates having floating voltage and surrounded by body regions without having source regions, said multiple trenched floating gates having trench depth equal to or deeper than junction depth of said body regions;

at least one channel stop trenched gate formed in said termination area and around outside of said multiple floating trenched gates, each said trenched channel stop gate being connected to at least one sawing trenched gate, each said sawing trenched gate being extended across over a scribe line;

each of said trench MOSFETs further comprising:

a substrate of a first conductivity type;

an epitaxial layer of said first conductivity type grown on said substrate, wherein said epitaxial layer having a lower doping concentration than said substrate;

a plurality of said source regions of said first conductivity type formed near top surface of said epitaxial layer only within said active area;

a plurality of first type body regions of a second conductivity type formed underneath said source regions in said active area;

a plurality of second type body regions of a second conductivity type formed in said epitaxial layer from top surface of said epitaxial layer around outside of said active area including said termination area;

said source regions being not disposed in the top of said second type body regions;

a plurality of shielded trenched gates in said active area, wherein each said shielded trenched gate having dual gate electrodes comprising a gate electrode disposed in the upper portion and a shielded electrode disposed in the lower portion, wherein said gate electrode and said shielded electrode insulated from each other by an inter-electrode insulation layer;

said gate electrode in said shielded trenched gates connected to a gate metal formed over said insulation layer and said shielded electrode in said shielded trenched gates connected to a source metal formed over said insulation layer;

each said shielded trenched gate in said active area further comprises a first type gate oxide layer surrounding bottom and sidewalls of said shielded electrode, and a second type gate oxide along sidewalls of said gate electrode;

multiple floating trenched gates having floating voltage in parallel formed in termination area around outside of said active area and surrounded by said second type body regions and extending into said epitaxial layer, said floating trenched gates having trench depth equal to or deeper than junction depth of said second type body regions;

each said second type body region between two adjacent of said floating trenched gates in said termination area having floating voltage;

at least one channel stop trenched gate formed in said termination area and around outside of said multiple floating trenched gates, each said channel stop trenched gate being connected to at least one sawing trenched gate, wherein each said sawing trenched gate being extended across a scribe line; and a drain metal on rear side of said substrate wherein said sawing trenched gate has said dual gate electrodes same as in active area.

8. The semiconductor power device of claim 1, wherein said multiple floating trenched gates in said termination area have same trench width and depth as said shielded trenched gates in said active area.

9. The semiconductor power device of claim 1, wherein said first type gate oxide has oxide thickness greater than said second type gate oxide.

10. The semiconductor power device of claim 1, wherein said first conductivity type is N type and said second conductivity type is P type.

11. The semiconductor power device of claim 1, wherein said first conductivity type is P type and said second conductivity type is N type.

12. The semiconductor power device of claim 1, wherein each said source region in said active area has uniform doping concentration and junction depth along the top surface of said epitaxial layer.

13. The semiconductor power device of claim 1, wherein each said source regions in said active area has doping concentration of Gaussian-distribution from edge of each said trenched source-body contacts to adjacent channel region near said shielded trenched gate, and has source junction depth near edge of said trenched source-body contacts greater than near said adjacent channel region.

* * * * *